United States Patent
Hirayanagi

(10) Patent No.: US 6,171,736 B1
(45) Date of Patent: Jan. 9, 2001

(54) PROJECTION-MICROLITHOGRAPHY ALIGNMENT METHOD UTILIZING MASK WITH SEPARATE MASK SUBSTRATES

(75) Inventor: Noriyuki Hirayanagi, Kawasaki (JP)

(73) Assignee: Nikon Corporation, Tokyo (JP)

(*) Notice: Under 35 U.S.C. 154(b), the term of this patent shall be extended for 0 days.

(21) Appl. No.: 09/404,917

(22) Filed: Sep. 24, 1999

Related U.S. Application Data

(62) Division of application No. 09/122,208, filed on Jul. 23, 1998.

(30) Foreign Application Priority Data

Jul. 23, 1997 (JP) .................................................. 9-196699
Jul. 30, 1997 (JP) .................................................. 9-218343

(51) Int. Cl.$^7$ .................................................. G03F 9/00
(52) U.S. Cl. .............................. 430/22; 430/30; 430/296; 430/942
(58) Field of Search ............................... 430/22, 296, 5, 430/30, 942

(56) References Cited

U.S. PATENT DOCUMENTS

| | | | |
|---|---|---|---|
| 4,780,617 | 10/1988 | Umatate et al. | 250/548 |
| 4,962,318 | 10/1990 | Nashi | 250/548 |
| 5,115,456 | 5/1992 | Kimura et al. | 378/35 |
| 5,260,151 | 11/1993 | Berger et al. | 430/5 |
| 5,393,988 | 2/1995 | Sakamoto | 250/492 |
| 5,396,335 | 3/1995 | Hasegawa et al. | 356/401 |
| 5,422,491 | 6/1995 | Sakamoto | 250/492 |
| 5,570,405 | 10/1996 | Chan et al. | 378/35 |
| 5,798,194 | * 8/1998 | Nakasuji et al. | 430/5 |

FOREIGN PATENT DOCUMENTS

| | | |
|---|---|---|
| 61-44429 | 3/1986 | (JP) . |
| 62-291133 | 12/1987 | (JP) . |
| 3-153015 | 7/1991 | (JP) . |
| 5-160012 | 6/1993 | (JP) . |
| 10020481A | 7/1996 | (JP) . |

OTHER PUBLICATIONS

Bohlen et al., "Electron–Beam Proximity Printing—A New High–Speed Lithography Method for Submicron Structures," *IBM J. Res. Develop.*, vol. 26, No. 5, 568–579, 1982.

Behringer et al., "Repair techniques for silicon transmission masks used for submicron lithography," *J. Vac. Sci. Technol. B.*, vol. 4, No. 1, 94–99, Jan./Feb. 1986.

Smith et al., "A new approach to high fidelity e–beam and ion–beam lithography based on an in situ global–fiducial grid," *J. Vac. Sci. Technol. B.*, vol. 9, No. 6. 2992–2995, Nov./Dec. 1991.

Liddle et al., "Mask fabrication for projection electron-–beam lithography incorporating the Scalpel technique," *J. Vac. Sci. Technol. B.*, vol. 9, No. 6, 3000–3004, Nov./Dec. 1991.

U.S. application No. 09/115,107, Yahiro et al., filed Jul. 13, 1998.

\* cited by examiner

*Primary Examiner*—Mark F. Huff
*Assistant Examiner*—Saleha R. Mohamedulla
(74) *Attorney, Agent, or Firm*—Klarquist Sparkman Campbell Leigh & Whinston, LLP

(57) ABSTRACT

Projection-microlithography masks and methods are disclosed for aligning a mask in a pattern-transfer apparatus and transferring a pattern image as defined by the mask onto a sensitized substrate using a charged-particle beam or other suitable microlithography energy source. A mask of the present invention can comprise a pattern defined on a plurality of thin mask reticles or films. The plurality of mask reticles are secured to a single retention member. The mask further comprises fiducial marks, defined on the retention member and fine-alignment marks defined on each of the mask reticles, to facilitate alignment of the mask and correction of pattern-image errors resulting from distortion or movement of the mask reticles prior to exposing the substrate to the pattern image.

6 Claims, 9 Drawing Sheets

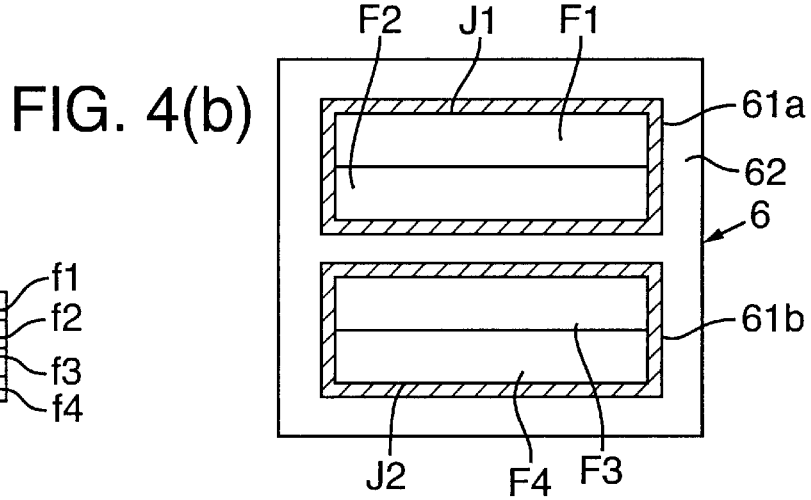
FIG. 4(a)
FIG. 4(b)
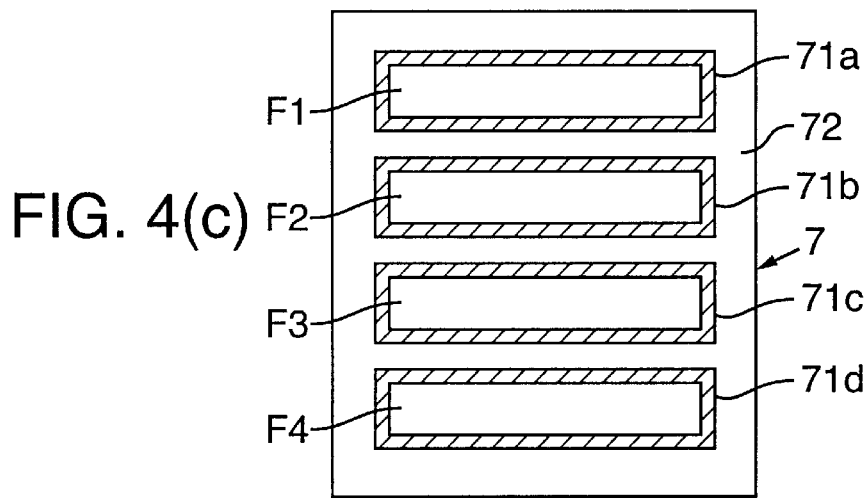
FIG. 4(c)
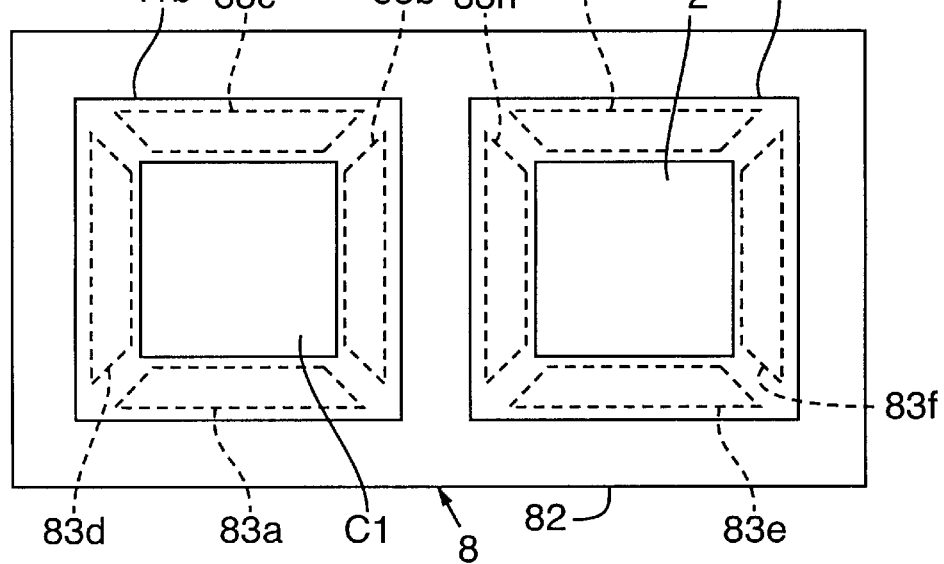
FIG. 5

PROJECTION-MICROLITHOGRAPHY ALIGNMENT METHOD UTILIZING MASK WITH SEPARATE MASK SUBSTRATES

This is a divisional application of U.S. patent application Ser. No. 09/122,208, filed Jul. 23, 1998 pending.

FIELD OF THE INVENTION

The invention pertains to charged-particle-beam-projection-microlithography masks and methods for transferring a pattern, as defined by the mask, onto a sensitized substrate.

BACKGROUND OF THE INVENTION

In charged-particle-beam (CPB) projection-microlithography as used in the fabrication of integrated circuits, a circuit pattern defined by a reticle or mask is irradiated with a charged-particle beam to transfer the pattern defined by the reticle or mask to a sensitized substrate (e.g., a semiconductor wafer). In recent years, CPB projection-microlithography apparatus ("pattern-transfer apparatus") have been developed that exhibit improved resolution of the transferred pattern and improved product throughput (i.e., the number of semiconductor wafers that can be exposed with a pattern per unit time). With certain conventional CPB pattern-transfer apparatus, one or more entire die patterns defined on a mask are transferred onto the wafer in a single exposure. A "die" is a pattern coextensive with the bounds of an integrated circuit or other device to be transferred onto the wafer (usually multiple dies are exposed at respective locations on the wafer).

It is difficult to produce a mask for a CPB pattern-transfer apparatus that transfers multiple dies or even an entire die in a single exposure while also providing the high resolution and circuit densities demanded in recent years. In addition, conventional CPB pattern-transfer apparatus that transfer multiple dies or an entire die pattern per exposure cannot satisfactorily control aberrations arising in the CPB-optical system through which the charged-particle beam passes, especially over a large optical field covering one or more dies. To solve this problem, CPB pattern-transfer apparatus have been proposed in which a pattern to be transferred is divided into multiple field segments ("mask subfields") that are individually and separately exposed. Such a pattern is typically transferred using a "step-and-repeat" transfer scheme in which the individual mask subfields are sequentially transferred to corresponding "substrate subfields" on a wafer or other sensitized substrate. The substrate subfields are produced on the wafer surface in locations relative to each other such that the substrate subfields are "stitched" together in the correct order and alignment to reproduce the entire die pattern on the wafer surface (e.g., see U.S. Pat. No. 5,260,151).

A demagnifying "reduction" pattern-transfer apparatus irradiates a charged-particle beam onto a portion of a mask defining a circuit pattern of an entire die. An image of the die pattern is then demagnified and formed on the wafer (e.g., see Japanese Laid Open Patent Document No. Hei5-160012). Because a die pattern image cannot be transferred to the wafer with sufficiently high resolution when irradiating the entire die pattern in a single exposure, a step-and-repeat transfer scheme is used to transfer the die pattern to the wafer subfield-by-subfield.

A mask for use with a "partial-batch" pattern-transfer method defines a repeating pattern portion of an integrated circuit, such as a DRAM, and non-repeating patterns. The mask is irradiated and the pattern portion to be repeatedly transferred to the wafer is reduced and transferred thereto the desired number of times. The non-repeating pattern portions of the mask undergo direct writing to the wafer (i.e., the patterns are not reduced), typically using a conventional variable-shaped-beam method. The partial-batch pattern-transfer method improves wafer throughput in comparison to a variable-shaped-beam method.

By providing a mask defining the circuit pattern of an entire integrated-circuit chip and forming a reduced pattern image of the integrated circuit pattern on a sensitive substrate, it is possible to eliminate all need for direct writing of non-repeating pattern portions of a mask. By eliminating direct writing, wafer throughput is increased. However, to provide reduction transfer of all of the die patterns on a mask at a demagnification ratio of 1/20 to 1/50 and ensure the required pattern resolution, the dimensions of the mask pattern must be 20 to 50 times, respectively, the size of the complete wafer integrated-circuit pattern. Accordingly, currently, pattern-transfer demagnification-n ratios are only in the order of 1/2 to 1/4, to avoid having to use a mask having an unreasonable size.

Additionally, masks used for such reduction-pattern-transfer methods typically are made by using a self-supporting, thin film of silicon, having a thickness of about 1 $\mu$m to about 30 $\mu$m. As masks used for reduction-pattern transfer necessarily increase in size, it is exceedingly difficult to form a self-supporting thin film to form the mask. Additionally, as the mask increases in size, deformations of such thin-film masks increase, making it difficult to ensure accuracy and precision in the formation of mask-pattern images on a wafer.

Moreover, semiconductor wafers for producing a mask of the size required for a higher demagnification ratio are not presently available. For example, for a 15 mm×30 mm integrated circuit having a demagnification ratio of about 1/8, the size of the mask-pattern region must be 120 mm×240 mm. Accordingly, the diagonal dimensions of the resulting mask would be approximately 268 mm. To produce a mask of such dimensions, a semiconductor wafer having a diameter of about 300 mm would be required; such semiconductor wafers are currently not available commercially.

Further, if a mask is comprised of a self-supporting thin film of silicon rather than comprising a patterned thin film of chrome on a quartz substrate (as is typically used in optical lithographic processes), positional distortion of the mask typically occurs.

The present invention makes it possible to produce a mask having a sufficiently large surface area for reduction-pattern transfer without the need for direct writing, while controlling cost increases in mask production and providing relatively high wafer throughput. In addition to providing the masks of the present invention, the present invention further provides mask-alignment and pattern-transfer methods that substantially eliminate degradation in mask-pattern-transfer accuracy typically associated with use of relatively large masks.

SUMMARY OF THE INVENTION

In light of the foregoing deficiencies in the prior art, the present invention provides projection-microlithography masks and methods for aligning a mask in a pattern-transfer apparatus and transferring a pattern image, as defined by the mask, onto a sensitized substrate using a charged-particle beam or other suitable microlithography energy source. The pattern-transfer masks and methods of the present invention provide masks for reduction-pattern transfer at relatively high demagnification ratios, methods for mask alignment, and provide transfer of corrected mask-pattern images onto a substrate with high accuracy and throughput.

An embodiment of a mask according to the present invention comprises a pattern defined on a plurality of thin mask reticles. The plurality of mask reticles are secured to a single mask-reticle retention member. The mask reticle patterns are divided into multiple mask subfields. Each mask subfield comprises a respective portion of the overall pattern to be transferred from the mask to the substrate. The mask further comprises initial alignment or fiducial marks formed on the retention member and fine alignment marks formed on each of the mask reticles. The alignment marks facilitate alignment of the mask and correction of pattern-image errors resulting from mechanically or thermally induced distortion of the mask reticles. Such alignment/correction is performed prior to exposing a sensitive substrate to the mask-reticle patterns.

In an embodiment of the alignment method of the present invention, before the mask is mounted in a pattern-transfer apparatus, the positional relationships between each of the mask reticles and the retention member are determined and stored in a memory device. The mask is then mounted in the pattern-transfer device, preferably on a mask stage. The positions of the fiducial marks on the retention-member are detected and data indicative of the positional coordinates of the retention member fiducial marks are stored in the memory device. The positional coordinates of the reference mark on the sensitive substrate stage are then detected and the data indicative of the substrate-stage positional coordinates (hence, the substrate position) are stored in the memory device. Alternatively, rather than detecting the reference mark on the substrate stage, the charged-particle beam is irradiated on each of the fine-alignment marks on the mask to form images of the alignment marks on the sensitive substrate. The positions of the alignment-mark images on the sensitive substrate are then detected and data indicative of such positional coordinates of the sensitive substrate are stored in the memory device. From such stored data, the positional relationship between the retention member and the substrate is determined.

Based on the positional relationships between the retention member and the individual mask reticles and the positional relationship between the retention member and the sensitive substrate, positional relationships between each of the mask reticles and the sensitive substrate are determined. Thereafter, deflection of the charged-particle beam and movement of the mask and substrate stages are made for each of the mask reticles based on such positional relationships and exposure of the sensitive substrate to each of the mask-reticle patterns, on a subfield-by-subfield basis, is then performed.

The foregoing and other objects, features, and advantages of the invention will become more apparent from the following detailed description of preferred embodiments which proceed with reference to the accompanying drawings.

BRIEF DESCRIPTION OF THE DRAWINGS

FIG. 4(a) illustrates a single exposure unit D on a sensitive substrate.

FIG. 4(b) is a plan view of a second embodiment of the mask of the present invention.

FIG. 4(c) is a plan view of a third embodiment oil the mask of the present invention.

FIG. 5 is a plan view of the first embodiment of the mask of the present invention (as shown in FIG. 1(c)), illustrating use of an electrostatic-attraction mask-reticle-securing mechanism.

DETAILED DESCRIPTION OF THE INVENTION

Figure 1A:
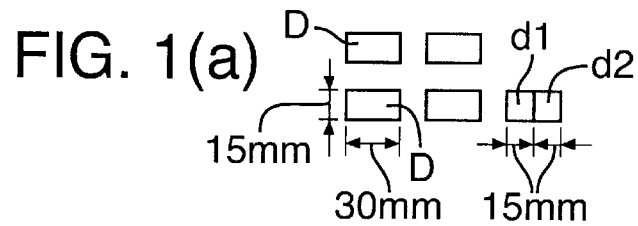
FIG. 1(a) is a partial plan view of substrate subfields on a sensitive substrate.
Figure 1B:
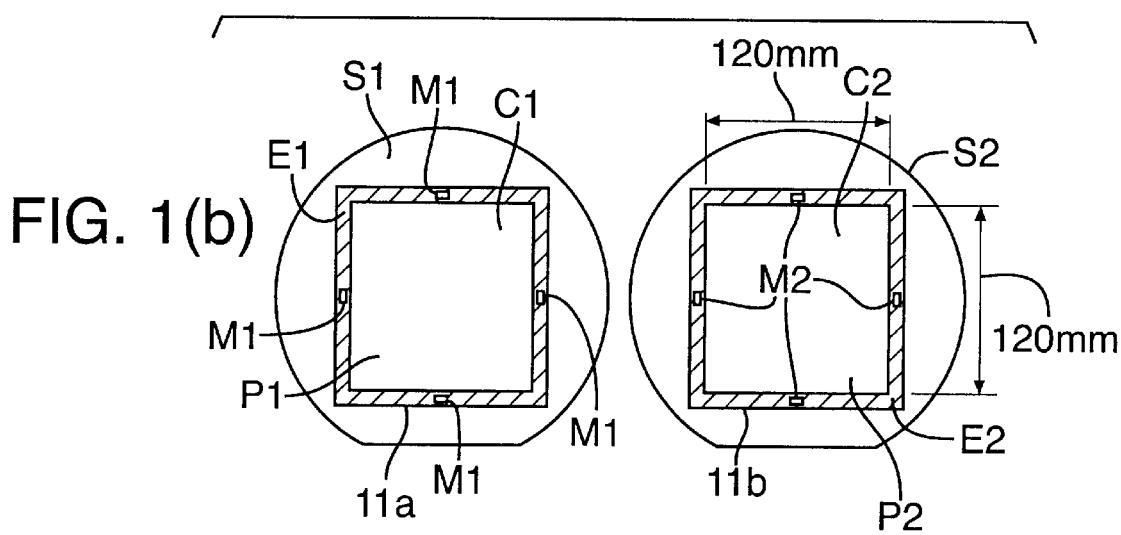
FIG. 1(b) is a plan view of mask reticles, of a first embodiment of the mask of the present invention as shown in FIG. 1(c), as found in respective mask substrates.
Figure 1C:
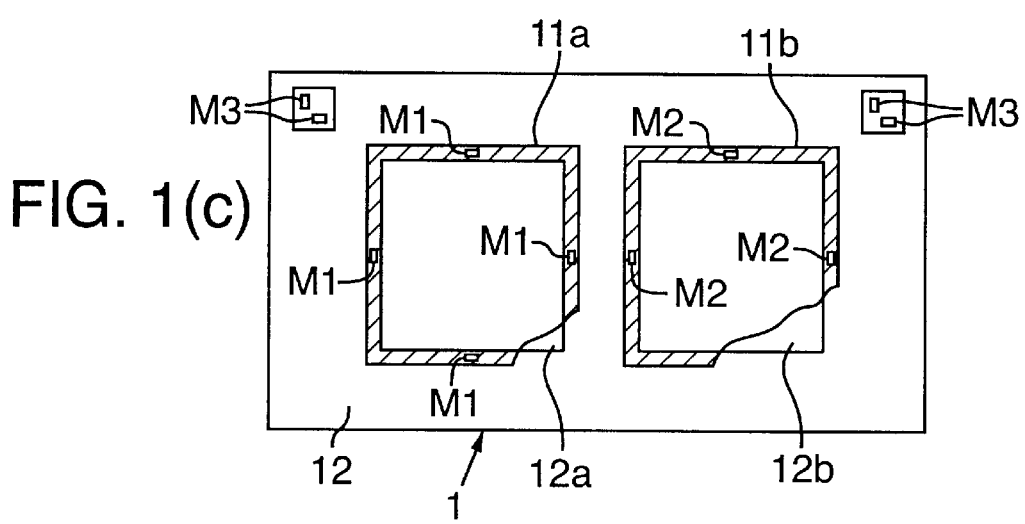
FIG. 1(c) is a plan view of the first embodiment of the mask according to the present invention.

Referring to FIG. 1(c), a first embodiment of the mask 1 according to the present invention comprises two or more divided mask reticles 11a, 11b ("mask reticles") mounted on a reticle-retention member 12 ("retention member"). The mask reticles 11a, 11b selectively transmit, absorb, and/or scatter charged particles irradiated thereon depending upon the mask reticle material. The mask 1 further comprises initial alignment marks (or "fiducial marks") M3 formed on the retention member 12 and fine alignment marks M1, M2 formed on the mask reticles 11a, 11b. The alignment marks may be formed using a variety of techniques as known to those persons skilled in the art (e.g., heavy-metal deposition, etching, etc.).

Referring to FIG. 1(b), mask reticles 11a, 11b define respective integrated circuit patterns that are to be transferred to a sensitive substrate, such as a semiconductor wafer. The mask reticles 11a, 11b are formed from separate mask substrates S1, S2. The mask substrates S1, S2 comprise conventional mask substrate materials, such as semiconductor wafers, amorphous materials, or metals. The mask reticles 11a, 11b are preferably comprised of silicon thin films each having a thickness of about 1 μm to about 30 μm. The mask reticles 11a, 11b are formed on substrate regions C1, C2 of the mask substrates S1, S2, respectively. The substrate regions C1, C2, and, hence, the mask reticle 11a, 11b, include respective mask-pattern regions P1, P2 and non-pattern regions or border regions E1, E2, respectively, located along the periphery of the pattern regions P1, P2. Border regions E1, E2 do not define any portion o)f the patterns of the respective mask reticles 11a, 11b.

Both mask reticles 11a, 11b are preferably secured to a single retention member 12 (FIG. 1(c)). The retention member 12 is preferably formed of a sufficiently rigid material, such as silicon or ceramic. The retention member 12 material is chosen to have sufficient strength such that mechanical or thermal effects do not result in significant deformations of the retention member as the mask is loaded into and/or used in a pattern-transfer apparatus. The retention member 12 includes retention-member apertures 12a, 12b, upon which retention-member apertures the pattern regions P1, P2 of the mask reticles 11a, 11b, respectively, are coextensive. The border regions E1, E2 of the mask reticles 11a, 11b, are mounted on or secured to the retention member 12 to be coextensive with the portion of the retention member 12 bordering the periphery of the apertures 12a, 12b. The resulting mask 1, comprising two or more mask reticles 11a, 11b, may then be handled as a single mask in the same manner as a conventional microlithography mask.

The mask reticles of the masks of the present invention (e.g., mask reticles 11a, 11b) may be mounted on or secured to a retention member by means of adhesion, electrostatic attraction, or a mechanical securing mechanism. For example, referring to FIG. 5, the mask reticles 11a, 11b are secured to a mask-retention member 82 by means of electrostatic force generated when a suitable voltage is applied to electrodes, such as electrodes 83a to 83h, on the retention member 82.

Figure 6:
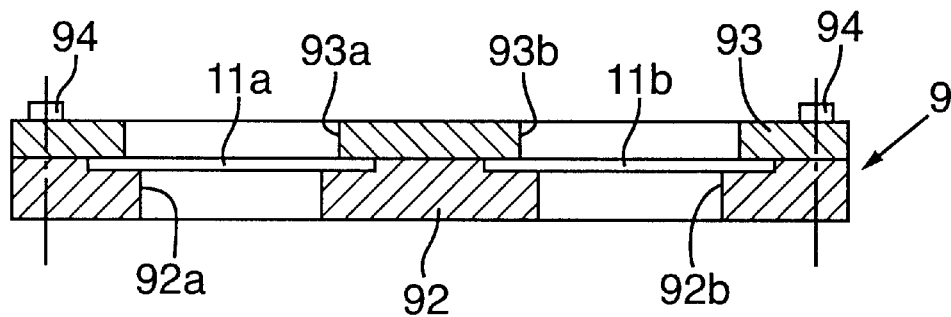
FIG. 6 is a cross-sectional view of the first embodiment of the mask according to the present invention (as shown in FIG. 1(c)), illustrating use of a mechanical mask-reticle-securing mechanism.

FIG. 6 illustrates one of a variety of manners in which the mask reticles of the present invention, such as mask reticles 11a, 11b, may be mechanically secured to a retention member. The mask reticles 11a, 11b are secured to a retention member 92 by means of gripping the mask reticles 11a, 11b between the retention member 92 and a pressure plate 93. Pressure plate 93 is secured to the retention member 92 using fasteners, such as screws 94. Apertures 92a, 92b, 93a, and 93b are defined by the retention member 92 to accommodate the pattern regions of the mask reticles 11a, 11b.

If a demagnification ratio of about 1/8 is desired using substrates C1, C2 individually having dimensions of about 120 mm×120 mm and diagonal dimensions of each substrate region of about 170 mm, then the mask reticles 11a, 11b may be produced from conventional wafers having diameters of about 200 mm. A 200-mm wafer may be used for forming a mask that will undergo such a demagnification, even when border regions E1, E2 of the mask reticles are included. As discussed above, prior to the present invention, a wafer having a diameter of about 300 mm was necessary to produce a similar mask for use in a pattern-transfer apparatus employing a similar reduction rate. Moreover, at such demagnification ratios, when using a substrate with a size identical to a conventional substrate, the substrate can accommodate a chip larger than conventionally possible.

Figure 3:
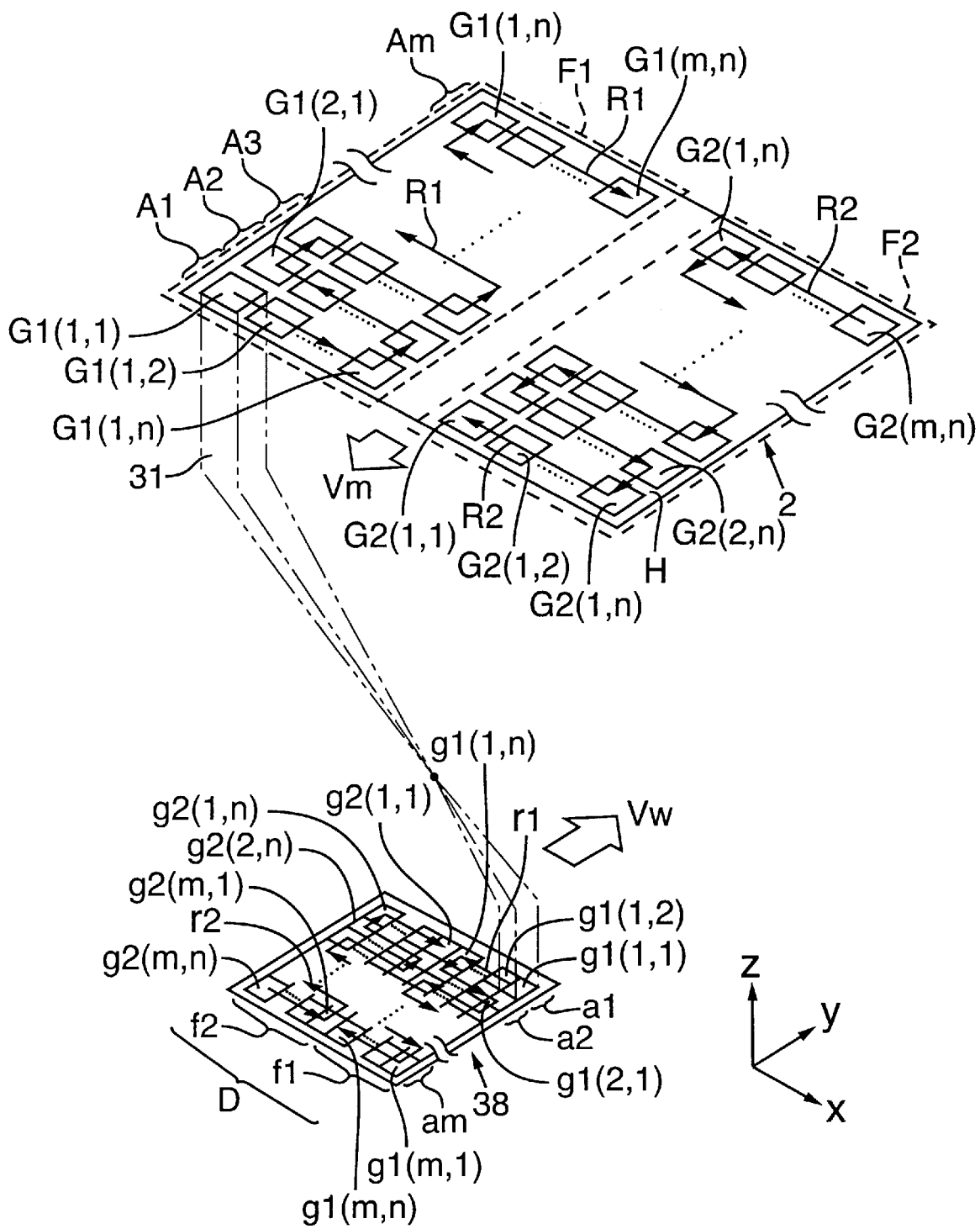
FIG. 3 is a partial perspective view of the first embodiment of the mask of the present invention (as shown in FIG. 1(c)) and a corresponding sensitive substrate.

FIG. 1(a) illustrates portions of a sensitive substrate on which images of a mask-pattern are to be formed. Referring to FIG. 1(a) and FIG. 3, a single exposure unit D on the sensitive substrate 38 is equivalent to, for example, one die or integrated-circuit chip. For ease of description, assume that the dimensions of one exposure unit D on the silicon wafer or sensitive substrate 38 are about 15 mm×30 mm and the demagnification ratio of the exposure is to be about 1/8. Assume further that a reduction step-and-repeat transfer scheme is followed wherein, for each step, the pattern within an exposure unit D is formed on the sensitive substrate. By forming pattern images on each exposure unit D, a plurality of integrated circuits are formed on the sensitive substrate 38. Alternatively, each exposure unit D may be further divided into smaller units, such as two exposure units d1, d2 (each exposure unit d1, d2 being about 15 mm×15 mm in area) (FIG. 1(a)). Smaller exposure units typically provide higher pattern resolution.

For convenience in describing the transfer of patterns from the mask reticles 11a, 11b to the sensitized substrate 38, orthogonal coordinate axes are used as shown in FIG. 3 such that a Z-axis is parallel to an optical axis of a charged-particle beam 31, and an X-axis and a Y-axis are parallel to the mask 1 and surfaces of the sensitive substrate 38.

Exposure of the sensitive substrate 38 to the patterns of the mask reticles 11a, 11b is described with reference to FIGS. 2–4. As shown in FIGS. 3 and 4(a), the exposure unit D on the sensitive substrate 38 (preferably the pattern of one entire die) is divided into a plurality of primary regions, such as primary regions f1, f2 shown in FIG. 3. Each primary region f1, f2 is further divided into a plurality of substrate subfields g1(1,1)–g1(m,n), g2(1,1)–g2(m,n). The substrate subfields g1(1,1)–g1(m,n), g2(1,1)–g2(m,n) are positioned adjacent to one another in a grid pattern.

Referring to FIG. 3, the patterns defined by the mask reticles include primary regions (or "continuous-exposure regions") F1, F2. Each primary region F1, F2 is further divided into a plurality of mask subfields G1(1,1)–G1(m,n), G2(1,1)–G2(m,n) respectively, that correspond to the primary regions and substrate subfields of the sensitive substrate 38, respectively. The mask subfields G1(1,1)–G1(m, n), G2(1,1)–G2(m,n) may be separated from one another by a non-pattern region H. The non-pattern region H preferably includes a thin-film reinforcement member (not shown) to augment the strength of the mask. During exposure of the sensitive substrate 38 to the mask-patterns, the pattern of a single subfield (e.g., G1(m,n) of a mask reticle is transferred to the corresponding substrate subfield (i.e., g1(m,n) on the sensitive substrate 38. More particularly, during exposure of the sensitive substrate 38, the mask 1 and the sensitive substrate are moved in a pattern-transfer apparatus (e.g., the first embodiment of the pattern-transfer apparatus shown in FIG. 2) in directions opposite to one another. As shown in FIG. 3, while the mask 1 is continuously moved in the −Y-axis direction Vm, the sensitive substrate 3E. is continuously moved in the +Y-axis direction Vw. A charged-particle beam 31, incident to the mask 1, scans the mask parallel to the X-axis in scan directions R1 and R2. The charged-particle beam is scanned in the +X-axis to irradiate the patterns of all of the mask subfields G1(1,1)–G1(1,n) of row A1 and transfer the patterns of the subfields one-by-one onto the corresponding substrate subfields g1(1,1)–g1(1,n). Following completion of exposure of all of the mask subfields in row A1, the charged-particle beam 31 is scanned in the opposite direction, the −X-axis direction. The mask subfields G1(2,1)–G1(2,n) in row A2 are then irradiated and transferred onto the corresponding substrate subfields g1(2, n)–g1(2,1) until all of the subfield patterns of primary region F1 are transferred. That is, as the mask 1 and the sensitive substrate 38 are continuously moved as discussed above, the exposure process is repeated for each row of the mask subfields, i.e., through row Am.

Following completion of the irradiation of the patterns of the primary region F1, the mask 1 is incrementally moved in the −X-axis direction an amount equal to the X-axis direction pitch of the mask primary regions F1, F2. At the same time, the sensitive substrate 38 is incrementally moved in the +X-axis direction an amount equal to the X-axis direction pitch of the substrate primary regions f1, f2. Thereafter, while the mask 1 is continuously moved in the +Y-axis direction and the sensitive substrate 38 is continuously moved in the −Y-axis direction, the patterns of the mask subfields G2(1,1)–G2(m,n) in the mask primary region F2 are irradiated with the charged-particle beam 31. Images of the patterns of the mask subfields G2(1,1)–G2(m,n) are formed on the corresponding substrate subfields g2(1,1)–g2(m,n). In this way, a single exposure unit D, preferably the pattern of an entire die, is formed on the sensitive substrate 38. Likewise, the patterns of a plurality of such die-integrated circuits are formed on the sensitive substrate 38.

Mask-alignment pattern-transfer methods of the present invention for the masks of the present invention are described below following a description of the various mask embodiments.

Referring to FIG. 4(b), a second embodiment of the mask of the present invention is shown, wherein the mask 6 is divided into two mask reticles 61a, 61b. The mask reticles 61a, 61b are both secured to a single retention member 62. The retention member 62 and mask reticles 61a, 61b preferably comprise the materials discussed above in relation to the first embodiment of the mask of the present invention. The mask reticles 61a, 61b are further divided into mask primary regions F1, F2 and F3, F4, respectively. Images of the patterns of mask primary regions F1, F2 in a region J1 of the mask reticle 61a are formed on the corresponding sensitive-substrate primary regions f1, f2 (as shown in FIG. 4(a)). Likewise, images of the patterns of the primary regions F3, F4 in a region J2 of the mask reticle 61b are formed on corresponding substrate primary regions f3, f4.

In a third embodiment of the mask of the present invention (FIG. 4(c)), a mask 7 comprises at least four mask reticles 71a–71d. Each of the mask reticles 71a–71d are secured to a single retention member 72. The retention member 72 and mask reticles 71a–71d preferably are comprised of the materials discussed above in relation to the first embodiment of the mask of the present invention. The mask reticles 71a–71d each comprise a separate, primary region F1–F4.

Figure 7:
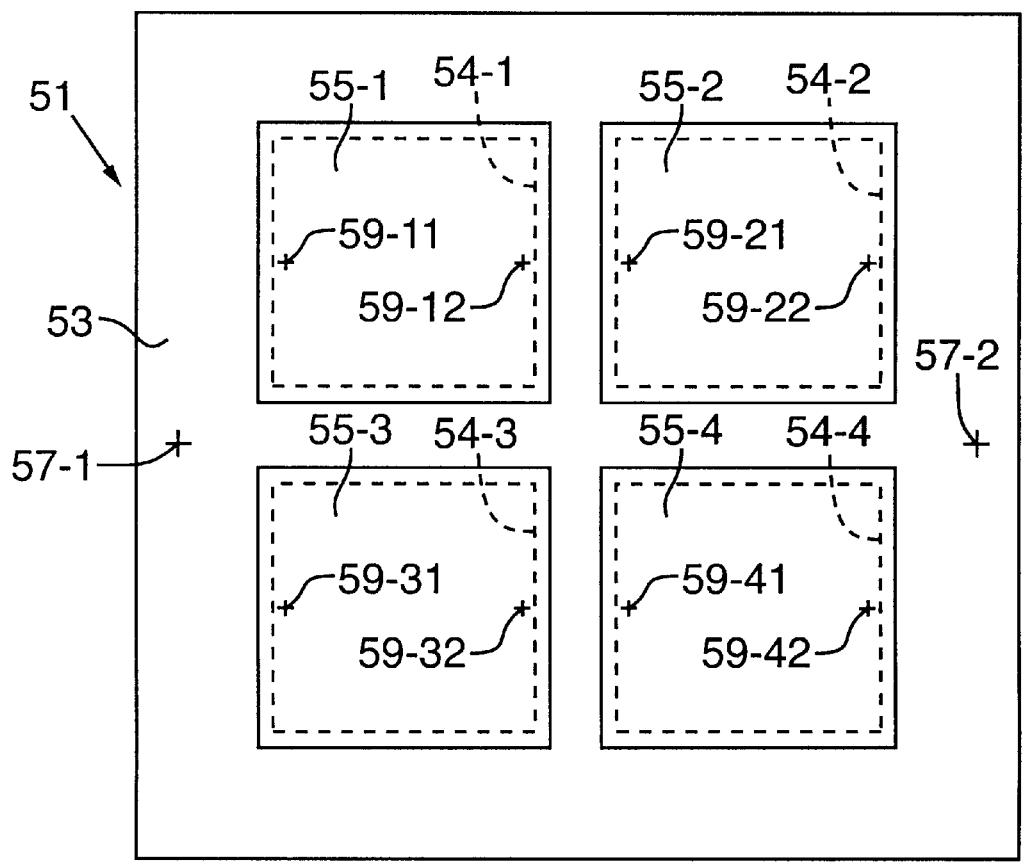
FIG. 7 is a plan view of a fourth embodiment of the mask of the present invention.

Referring to FIG. 7, a fourth embodiment of the mask of the present invention comprises four or more mask reticles 55-1 to 55-4 preferably positioned adjacent one another in a grid pattern. As with the first embodiment of the mask, the mask reticles 55-1 to 55-4 are preferably comprised of silicon thin films each having a thickness of about 1 μm to about 30 μm. The mask further comprises a retention member 53 to which the mask reticles are secured. As with the first embodiment of the mask of the present invention, the retention member 53 is preferably comprised of a rigid material that is about 3 mm in thickness and is, preferably, about 15 mm to about 20 mm square. The retention member 53 further includes at least four apertures 54-1 to 54-4, upon which apertures the pattern regions P1–P4 of the mask reticles 55-1 to 55-4, respectively, are coextensive. Border regions or peripheral edges (shown as dashed lines in FIG. 7) of each mask reticle 55-1 to 55-4 are adhered to or mounted on the retention member 53 to be coextensive with the portion of the retention member bordering the periphery of the apertures 54-1 to 54-4.

The mask 51 further comprises fiducial marks 57-1, 57-2 preferably formed on the left and right side edges of the retention member 53 surface, preferably at about the midpoints of each side. The fiducial marks 57-1, 57-2 on the maskretention member 53 allow a preliminary or initial alignment of the mask 51. The mask 51 further comprises fine-alignment marks 59-11, 59-12, 59-21, 59-22, 59-31, 59-32, and 59-41, 59-42, preferably at least two of the marks being on each mask reticle 55-1 to 55-4. The fine-alignment marks are preferably formed on the left and right sides of the mask reticles at about the midpoint thereof, and preferably as close to the edge of the mask reticle as possible.

The fine alignment marks on the mask reticles allow for secondary or fine-alignment of each mask reticle in the pattern-transfer apparatus. More specifically, the positional coordinates and rotation of the retention member 53 may be determined by measurement of the positions of the fiducial marks 57-1, 57-2. In addition, the positional coordinates and rotation for each mask reticle 55-1 to 55-4 may be determined by measurement of the positions of the fine-alignment marks 59-11 to 59-42. Such measurements are discussed below with reference to the methods of the present invention.

Figure 2:
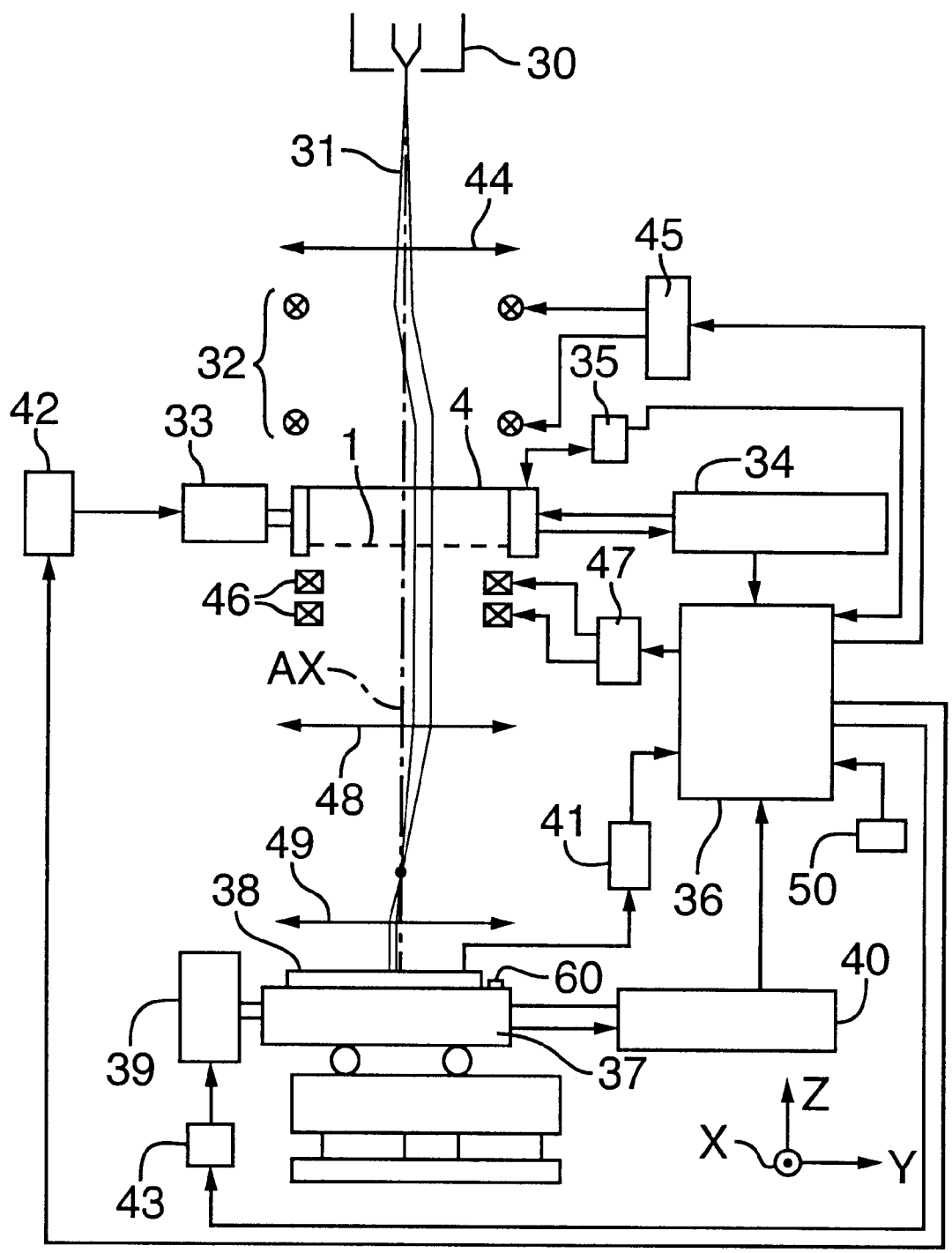
FIG. 2 is an elevational schematic diagram of a first embodiment of a pattern-transfer apparatus according to the present invention.

FIG. 2 illustrates a preferred embodiment of a pattern-transfer apparatus according to the present invention. In FIG. 2, the Z-axis is parallel to the initial trajectory axis (optical axis AX) of a charged-particle beam 31, the Y-axis extends in a direction horizontal with the plane of the page, and the X-axis extends in a direction perpendicular to the plane of the page.

For convenience, the masks and methods of the present invention are described primarily with reference to use of a charged-particle-beam apparatus to expose a mask-pattern onto a semiconductor wafer. It will be understood by persons skilled in the art, however, that the masks and methods of the present invention apply equally well to visible-light and ultraviolet-light apparatus, reticles, and various other suitable substrates, respectively.

Referring to FIG. 2, the pattern-transfer apparatus comprises along the optical axis AX in the trajectory direction of a charged-particle beam 31, a charged-particle-beam source 30 for emitting the charged-particle beam 31. A condenser lens 44 is positioned downstream of the beam source 30 to focus the beam 31 and irradiate the beam in a direction toward a mask 1. A first deflector 32 deflects the beam 31 that passes through the condenser lens 44 to a selected subfield on a selected mask reticle 11a, 11b, of the mask 1. The first deflector 32 is controlled by a first-deflector controller 45 that is, in turn, connected to a master controller 36.

The mask 1 is mounted on a mask stage 4 so as to extend in the X-Y plane. The mask stage 4 is preferably driven by a mask-stage driver 33 so as to be movable along the X-axis and Y-axis directions. The mask-stage driver 33 is controlled by a mask-stage controller 42 that is connected to and controlled by the master controller 36. The mask 1 may be mounted directly onto the mask stage 4, or the mask 1 may be mounted on a mask holder (not shown) that is, in turn, mounted onto the mask stage 4.

The position of the mask stage 4 along the X-axis. and Y-axis is detected by a first detector 34 ("mask-stage detector"). The mask-stage detector 34 preferably comprises a laser interferometer that is connected to the master controller 36 and provides data to the master controller 36 indicative of the detected position of the mask stage 4.

A second deflector 46 deflects the charged-particle beam 31 that passes through the selected subfield of the selected mask reticle 11a, 11b. The second deflector 46 is operated by a second deflector driver 47 that is connected to and controlled by the master controller 36. First and second projection lenses 48, 49 are positioned downstream of the second deflector 46 to form an image of the transmitted mask-subfield pattern on a substrate 38 (e.g., a semiconductor wafer).

Further with respect to FIG. 2, the sensitive substrate 38 is preferably mounted on a substrate stage 37 so as to be parallel to The XY plane. The substrate stage 37 preferably includes a substrate-reference mark 60. The upstream-facing surface of the sensitive substrate 38 is typically coated with a suitable resist or other "sensitizing" substance that is sensitive to exposure to the particles in the charged-particle beam 31 in an image-forming way. The substrate stage 37 is driven by a substrate-stage driver 39. The substrate-stage driver 39 is operated by a substrate-stage controller 43 that is connected to and controlled by the master controller 36. The substrate-stage driver 39 moves the substrate stage 37, and hence the substrate 38, in both the X-axis and Y-axis directions. A second detector 40 ("substrate-stage detector") connected to the master controller 36, determines the position of the substrate stage 37 along the X-axis and the Y-axis. The substrate-stage detector 40 provides data indicative of the position of the substrate stage 37 to the master controller 36. The substrate-stage detector 40 preferably comprises a laser interferometer.

The master controller 36 preferably comprises can arithmetic/logic unit connected to a memory device 50. An input device (not shown) may be connected to the master controller 36 for the input of data as required to the memory device 50 of the master controller for determination of deflection and stage movement necessary to correct for changes or distortions of the mask reticles (as discussed below).

A third detector 35 ("mask-alignment mark detector") is situated in the pattern-transfer apparatus so as to detect the positional coordinates of selected alignment marks on the mask 1, such as fine-alignment marks M1, M2. (See FIG. 1(c)). The third detector 35 preferably comprises any of the alignment mark detectors or detector systems discussed below, and most preferably comprises a Field-Image Alignment system, including an illumination source (e.g., white light) (not shown) and a CCD camera (not shown). The third detector 35 is connected to the master controller 36 and provides data to the master controller 36 indicative of the detected positions of the mask alignment marks.

A fourth detector 41 ("substrate-alignment-mark detector") is situated in the pattern-transfer apparatus to detect the position of a reference mark on the sensitive-substrate stage 37, such as the substrate-reference mark 60. The fourth detector 41 also detects the positional coordinates of images of the mask fine-alignment marks (not shown in FIG. 2) formed on the sensitive substrate 38. The fourth detector 41 preferably comprises the same type or types of detectors as described above in relation to the third detector 35. The fourth detector 41 is connected to the master controller 36 and provides data to the master controller 36 indicative of the detected positional coordinates of the substrate-reference mark 60 and images of the mask fine-alignment marks formed on the substrate 38.

Figure 8:
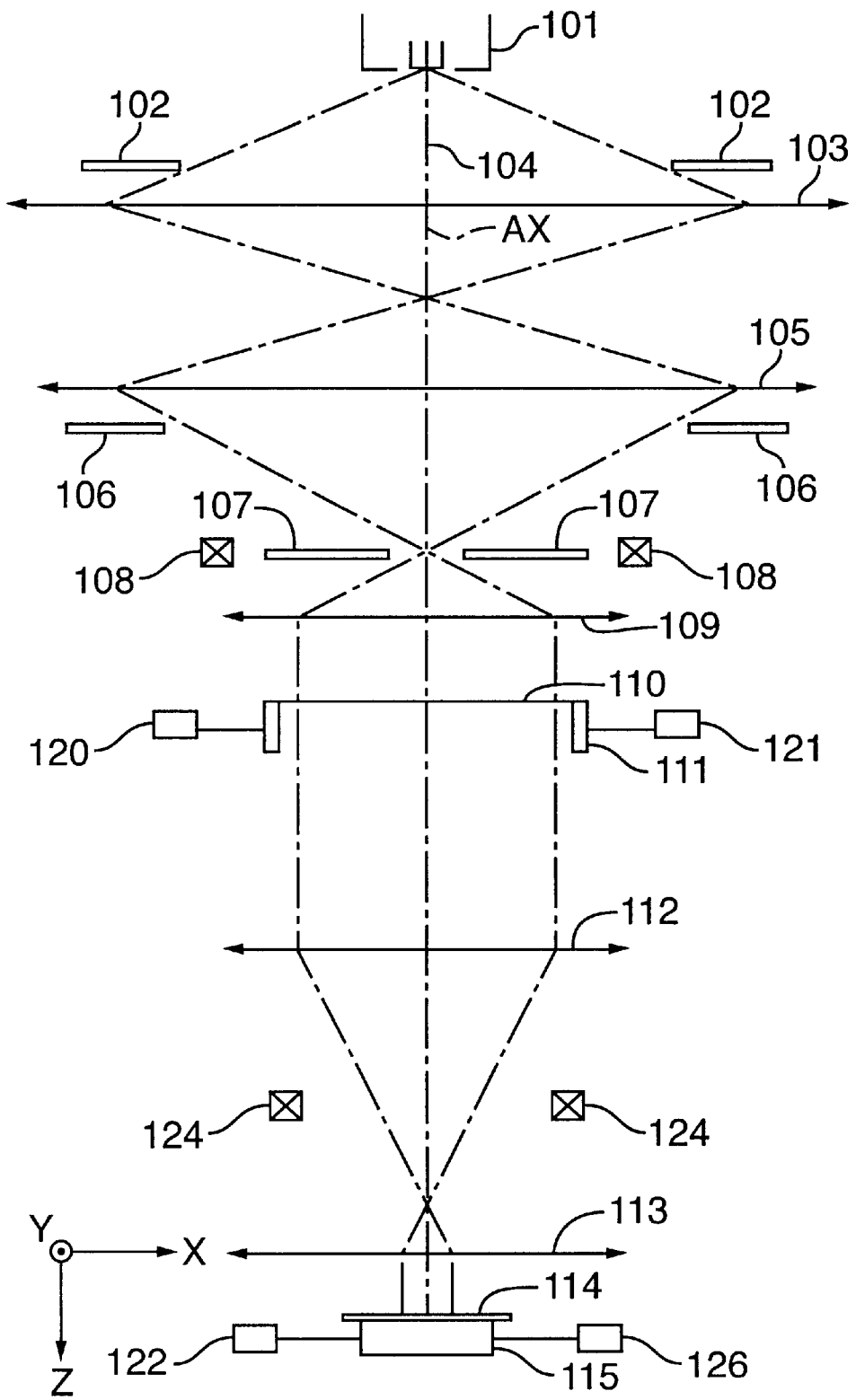
FIG. 8 is an elevational schematic diagram of a second embodiment of the pattern-transfer apparatus of the present invention.

FIG. 8 illustrates a second embodiment of a pattern-transfer apparatus according to the present invention. In FIG. 8, the Z-axis is parallel to the initial trajectory axis (optical axis AX) of a charged-particle beam 104, the X-axis extends in a direction horizontal with the plane of the page, and the Y-axis extends in a direction perpendicular to the plane of the page.

The FIG. 8 embodiment comprises, along the optical axis AX in the trajectory direction of a charged-particle-beam 104, a charged-particle beam source 101 (e.g., an electron gun) for emitting the charged-particle beam. A first aperture 102, preferably rectangular in profile, is positioned downstream of the beam source 101 to limit the transverse profile of the divergent charged-particle beam 104 emitted from the beam source 101 to dimensions equal to the size of a mask subfield.

Condenser lenses 103, 105 are positioned downstream of the first aperture 102 to focus the charged-particle beam 104 shaped by the aperture 102 and irradiate the beam 104 in a direction toward a mask. 110. A second aperture 106 positioned downstream of the condenser lenses 103, 105, also limits the transverse profile of the divergent charged-particle beam 104 transmitted by the condenser-lens system to dimensions equal to the size of a mask subfield. The image of the aperture 102 is formed on the second aperture 106 by the condenser lenses 103, 105.

A first deflector 108 is preferably positioned to be parallel with the blanking aperture 107 to selectively scan the charged-particle beam 104 along the X-axis direction, with the exposure of all the subfields within the selected main field taking place. A third condenser lens 109 is positioned downstream of the blanking aperture 107 and the first deflector 108. The third condenser lens 109 converges the charged-particle beam, makes the beam parallel to the optical axis AX, and thereafter forms an image of the second aperture 106 on the mask 110.

The mask 110 is mounted on a mask stage 111 so as to extend in the X-Y plane. The mask stage 111 is preferably driven by a mask-stage driver 120 so as to be movable along the X-axis and Y-axis directions. As the charged-particle beam 104 is directed toward the mask 110, the first deflector 108 deflects the beam onto a selected mask subfield (not shown).

Continuing to refer to FIG. 8, projection lenses 112, 113 and a second deflector 124 are positioned downstream of the mask 110. Downstream of the projection lenses 112, 113, a sensitive substrate 114 is preferably mounted on a substrate stage 115 so as to extend in the X-Y plane. The substrate stage 115 is preferably driven by a substrate-stage driver 122 so as to be movable along the X-axis and Y-axis directions. The projection lenses 112, 113 receive the charged-particle beam 104 transmitted through the selected subfield (not shown) of mask 110 and form a reduced image of the subfield pattern. The second deflector 124 deflects the reduced image to a selected position on the sensitive substrate 114. As the sensitive substrate 114 is exposed to the charged-particle beam 124, the reduced pattern of the mask image is formed on the substrate.

Position-measurement systems 121, 126, each preferably comprising a laser interferometer, are provided on both the mask stage 111 and the substrate stage 115, respectively, to determine the positions thereof. Preferably, a back-scattered-electron detector 116 or analogous device is positioned between the third condenser lens 109 and the mask 110 to detect electrons or charged particles back-scattered from the alignment marks (not shown) on the mask.

Positions of both the fiducial marks on mask-retention members of any of the masks of the present invention (e.g., fiducial marks 57-1, 57-2 of mask 51) and the fine-alignment marks of the mask reticles may be detected utilizing any of the following detection systems or any other suitable detection system known to those skilled in the art.

(1) Laser-Step Alignment (LSA)

An LSA system irradiates alignment marks on a mask with a laser light source and measures the positions of the alignment marks utilizing the diffraction and dispersion of the light to measure the position of anti alignment mark.

(2) Field-Image Alignment (FIA)

An FIA system irradiates alignment marks on a mask utilizing a source of light having a wide wavelength bandwidth, such as a halogen light source. The mask-alignment marks undergo image processing and the positions of the marks are then determined.

(3) Laser-Interferometric Alignment (LIA)

An LIA system irradiates alignment marks on a mask with two different sources of laser light, the laser light being emitted from two different directions. The two laser-light sources have slightly different respective frequencies. A diffraction grating on the masks causes the laser light incident thereon to interfere and change phase. The positions of the alignment marks are detected based on the change in phase of the laser lights.

The masks and methods of the present invention solve many of the deficiencies with prior-art reduction-pattern transfer by providing masks comprising a plurality of mask reticles secured to a single retention member and alignment marks on the masks. However, changes in position of the individual mask reticles on the retention member may occur as the mask is mounted into the pattern-transfer apparatus and/or as the mask is used over time. Accordingly, even though positional relationships between the individual mask reticles and the retention member are measured after the mask reticles are secured to the retention member, (i.e., "design" position data), the positional relationship between the mask reticles with one another and with the retention member (and, hence, with the substrate) may change as the mask is mounted in the pattern-transfer apparatus and/or is used in the apparatus.

Additionally, as the mask is used in the pattern-transfer apparatus, both mechanical and thermal effects on the mask may change the positional relationships between individual mask reticles and the retention member. Because image-transfer error correction is made, in part, based on the "design" positional relationships between the mask reticles with one another and with the retention member, as these positional relationships change, so must the amount and manner of image transfer error correction be adjusted. Accordingly, the following embodiments of mask-alignment/pattern-transfer methods of the present invention are provided.

A first embodiment of the mask-alignment/pattern-transfer method of the present invention is described with reference to the first embodiment of the mask of the present invention and the pattern-transfer apparatus illustrated in FIG. 2. Although the methods of the present invention are primarily discussed with reference to specific mask embodiments, it is understood that the methods disclosed herein are applicable to a variety of mask types, including, but not limited to, all of the masks encompassed by the present invention. Before the mask 1 is mounted in the pattern-transfer apparatus, the positional relationships between individual mask reticles 11a, 11b, and the retention member 12, are measured. That is, the positional coordinates of mask reticle fine-alignment marks M1, M2 in relation to the fiducial marks M3 on the retention member 12 (i.e., "design" positions) are determined and stored in the memory device 50, prior to mounting the mask in the pattern-transfer apparatus. The positions of the fine-alignment marks M1, M2 in relation to the fiducial marks M3 may be measured using conventional measurement apparatus known to those persons skilled in the art.

Referring to FIGS. 1(c) and 2, mask 1 is then mounted on the mask stage 4. The third detector 35 detects the actual position of the fiducial marks M3 on the retention member 12. Data indicative of the positional coordinates of the retention-member fiducial marks M3 are sent from the third detector 35 to the master controller 36 and memory device 50. The fourth detector 41 detects the positional coordinates of the reference mark 60 on the sensitive substrate stage 37. The mask-stage coordinates preferably coincide with the substrate-stage coordinates.

Based on the detected positions of the retention-member fiducial marks M3, and the detected position of the substrate stage and on the preliminary measurement results of the positional relationships between the mask reticles 11a, 11b and the retention member 12 stored in the memory, device 50, the master controller 36 determines the positional relationships between each of the mask reticles 11a, 11b and the sensitive substrate 38. Thereafter, the charged-particle beam 31 is detected by the first and second deflectors and the mask and substrate stages are moved based on such positional relationships for each mask reticle and exposure of the mask-reticle patterns on a subfield-by-subfield basis.

In a second embodiment of the method of the present invention, also described with reference to the first embodiment of the mask (FIG. 1(c)) and the pattern-transfer apparatus illustrated in FIG. 2, prior to mounting the mask 1 into the pattern-transfer apparatus, the positional relationship between the mask reticles 11a, 11b and the retention member 12 are input and stored in the memory device 50 of the master controller 36 as "design" position data. In other words, prior to mounting the mask 1 in the pattern-transfer apparatus and prior to any exposure of the sensitive substrate 38, the positions of the fine alignment marks M1, M2 of the mask reticles 11a, 11b, respectfully, and the positions of the fiducial marks M3 of the retention member 12 are determined (as described above in relation to the first embodiment of the present invention) and are stored as "design" position data.

Exposure of the sensitive substrate 38 to the patterns defined by the mask reticle 11a, 11b is then performed based on a correction determined from the "design" position data stored in the memory device 50 of the master controller 36 and actual position data corresponding to the mask-alignment mark positions after the mask is mounted in the pattern-transfer apparatus. More specifically, first, mask 1 is mounted onto mask stage 4, and the positions of the fiducial marks M3 of the retention member 12 are detected by the third detector 35 or by utilizing any of the detection systems set forth above. A fiducial measurement of the mask and substrate is then made based on the data indicative of the positional coordinates of the fiducial marks M3 relative to the sensitive substrate and/or relative to the substrate stage.

The "actual" positions of the mask fine-alignment marks M1, M2 and positions of the images of the mask fine-alignment marks M1, M2 formed on the sensitive substrate are then determined. Specifically, the charged-particle beam is used to irradiate each of the fine-alignment marks M1, M2 on the mask 1 to form images of the alignment marks on the sensitive substrate 38. The fourth detector 41 then detects the positional coordinates of the images of the alignment mark M1, M2 on the sensitive substrate and sends data indicative of such detected positional coordinates of the sensitive substrate 38 to the master controller 36. Data indicative of the positional coordinates of the fine-alignment marks M1, M2 and of the images of the fine-alignment marks on the sensitive substrate 38 are sent to the master controller 36 and are stored in the memory device 50.

The positional relationship between the mask reticles 11a, 11b and the sensitive substrate 38 is calculated by the master controller 36 based on a comparison of the "design" position data and the "actual" position data of the mask reticles 11a, 11b and the retention member 12, and the actual positions of the sensitive substrate 38. The master controller 36 then determines the amount of correction necessary based on the calculated positional relationship between the mask reticles 11a, 11b and the sensitive substrate 38. Thereafter, appropriate deflection of the beam by the first and second deflectors 32, 46 is made along with appropriate movement of the mask and substrate stages to adjust for the determined positional relationships. The substrate 38 is then exposed to the respective patterns define by the mask reticles 11a, 11b.

More specifically, based on the calculated positional relationship between the mask reticles and the substrate, the master controller 36 determines the desired position of the charged-particle beam 31 (and the amount of deflection of the beam necessary), as well as any necessary movement of the mask stage 4 and of the sensitive-substrate stage 37. The calculated results are output from the master controller 36 to the two stage drivers 42, 43 and to the first and second deflector controllers 45, 47. The positional relationship between the mask reticles 11a, 11b and the sensitive-substrate stage 37 may also be measured using the fourth detector 41 to determine the position of the substrate-reference mark 60 disposed on the substrate stage.

Figure 9:
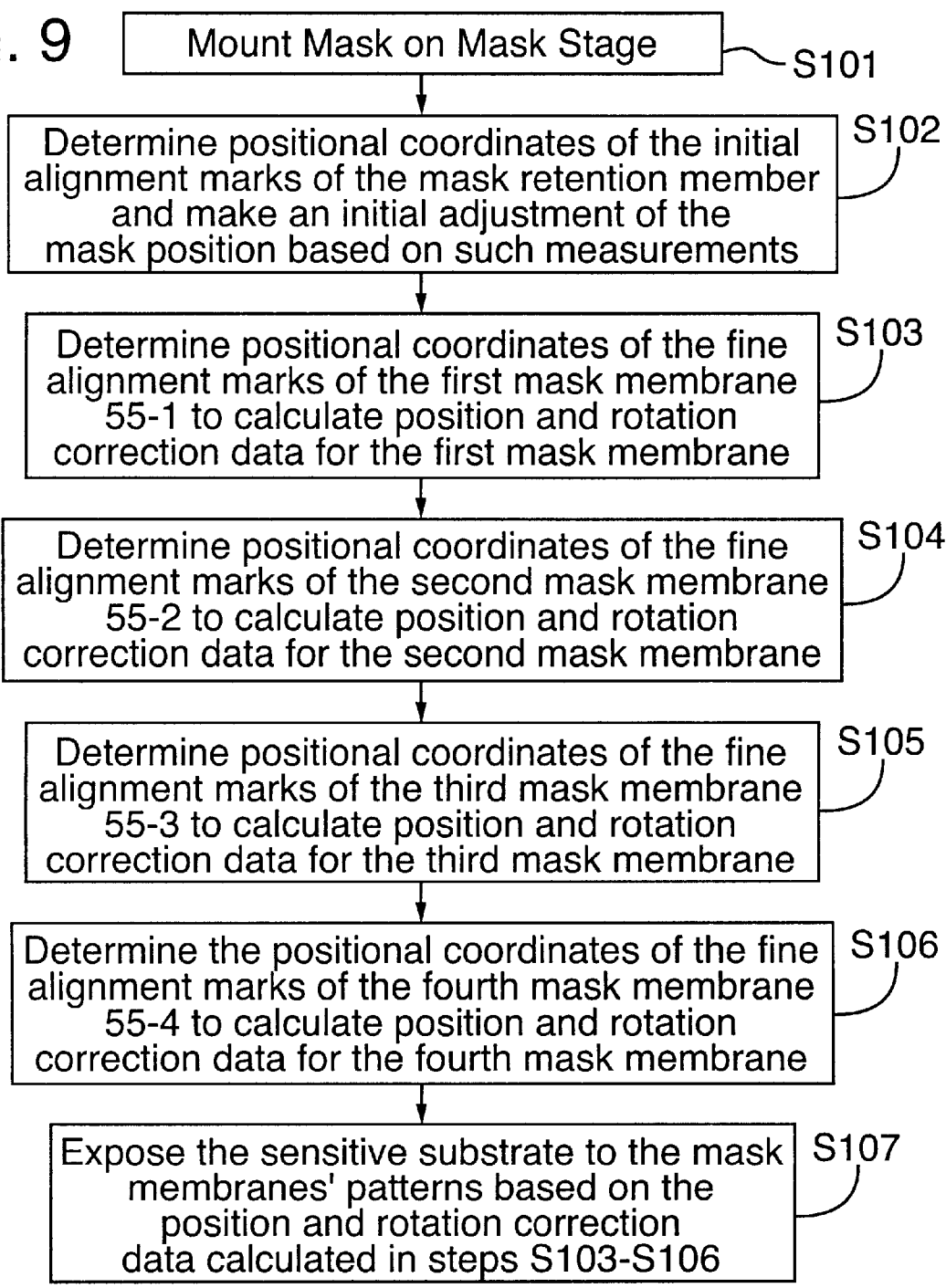
FIG. 9 is a flowchart illustrating a third embodiment of the mask-alignment/pattern-transfer method of the present invention.

A third embodiment of the mask-alignment/mask-pattern transfer method of the present invention is illustrated in the flow chart of FIG. 9. Although the third embodiment of the method of the present invention is described with reference to the fourth embodiment of the mask (i.e., mask 51, FIG. 7), other masks, including other embodiments of the masks of the present invention, may be utilized to practice the third embodiment of the method.

Referring to FIGS. 7 and 9, mask 51 is mounted on a mask stage of a pattern-transfer apparatus, such as the pattern-transfer apparatus illustrated in FIG. 8 (step S101). Using one of the detection systems mentioned above, the positional coordinates of the alignment marks of the mask retention member and of the mask reticles are determined. Specifically, the position of the mask-retention member 53 (FIG. 7) is determined by detecting the positional coordinates of the fiducial marks 57-1, 57-2 (step S102). Initial alignment of the mask and substrate is performed based on the positional coordinates of the retention-member alignment marks. Next, the position of the first mask reticle 55-1 is determined by detecting the positional coordinates of the fine-alignment marks 59-11, 59-12 on the mask reticle 55-1 (step S103). This sequence is repeated for each of the mask reticles 55-2 to 55-4 to determine the positional coordinates of each of the fine-alignment marks of each of the mask reticles (steps S104, S105, S106). A calculation method, such as the least-squares method, is used to determine the appropriate correction amounts. The mask-reticle patterns are then transferred to a sensitive substrate following adjustment of the beam deflection and of the mask and substrate stages to correct for scaling, position, and rotation errors based on the determined positional coordinates of each mask reticle (step S107).

Figure 10:
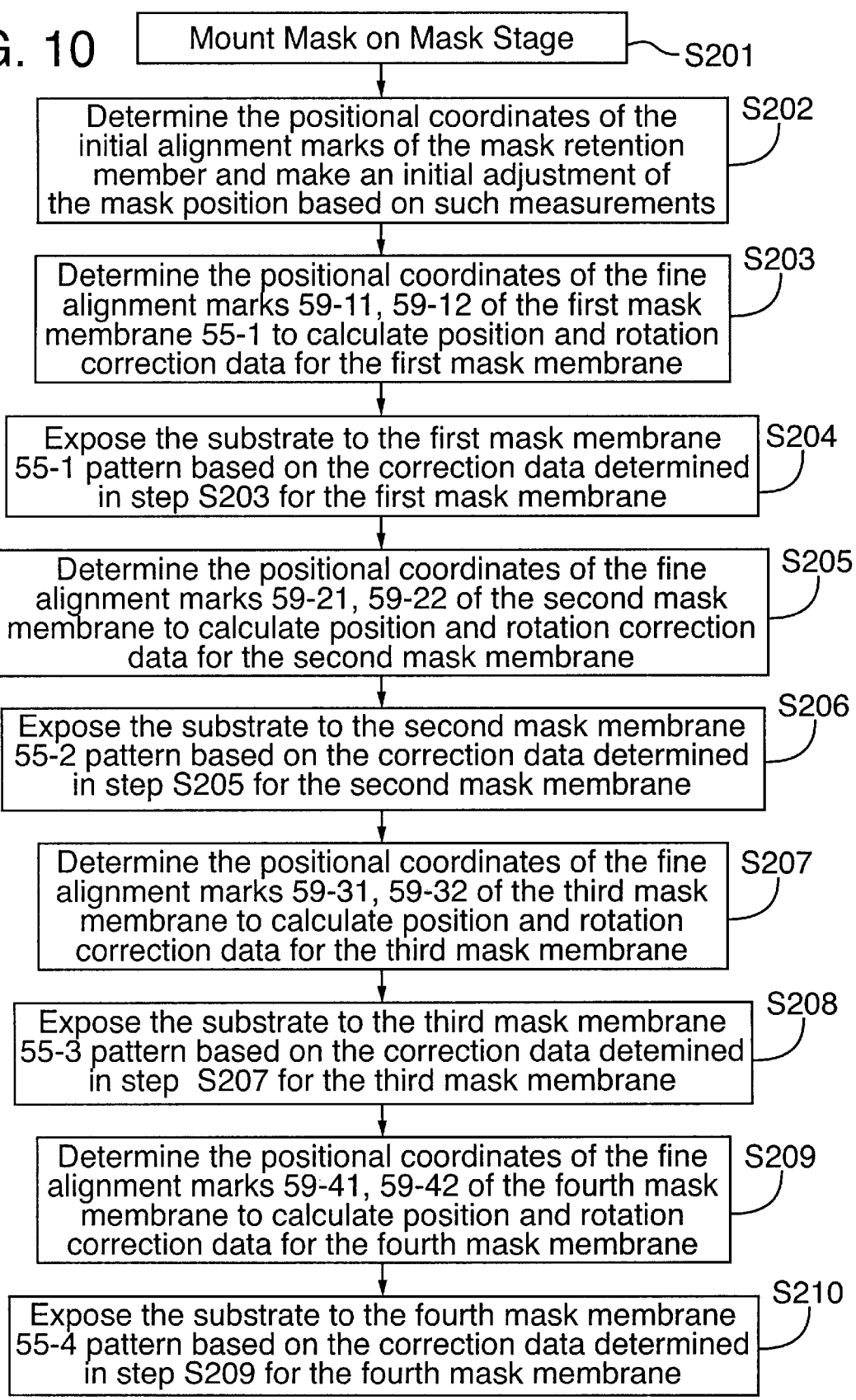
FIG. 10 is a flowchart illustrating a fourth embodiment of the mask-alignment/pattern-transfer method of the present invention.

A fourth embodiment of the mask alignment and mask-pattern-transfer methods of the present invention is illustrated in the flow chart of FIG. 10. Although the fourth embodiment of the method of the present invention is described with reference to the fourth embodiment of the mask (i.e., mask 51, FIG. 7) other masks, including other masks of the present invention, may be utilized to practice the method.

Referring to FIGS. 7 and 10, mask 51 is mounted on a mask stage (step S201). The position of the mask-retention member is determined based on the detected positional coordinates of the fiducial marks 57-1, 57-2 (step S202). An initial alignment of the mask and substrate is made based on the detected position of the retention-member-alignment marks. The position of the mask reticle 55-1 is then determined by detecting the positional coordinates of the fine-alignment marks 59-11, 59-12 on the first reticle (step S203). The measurement sequence is the same as described above in relation to the third embodiment of the method. However, in the fourth embodiment of the mask-alignment/pattern-transfer method, transfer of the patterns of each mask reticle is immediately performed following determinations of the scaling, position, and rotation correction amounts for that particular mask reticle, based on such corrections (step S203). A calculation method, such as the least-squares method, is used to determine such correction amounts.

Transfer of each mask-reticle pattern to the substrate is performed, directly following the mask-reticle scaling, position, and rotation corrections, for each of the mask reticles 55-2 to 55-4. Accordingly, the fourth embodiment of the method of the present invention requires a number of shifts between alignment of the mask and exposure of the substrate to the mask-reticle patterns. Although wafer throughput using the fourth embodiment of the method is reduced relative to the previously discussed embodiments of the method of the present invention, it is possible to perform more accurate pattern transfers utilizing the fourth embodiment of the method.

Figure 11:
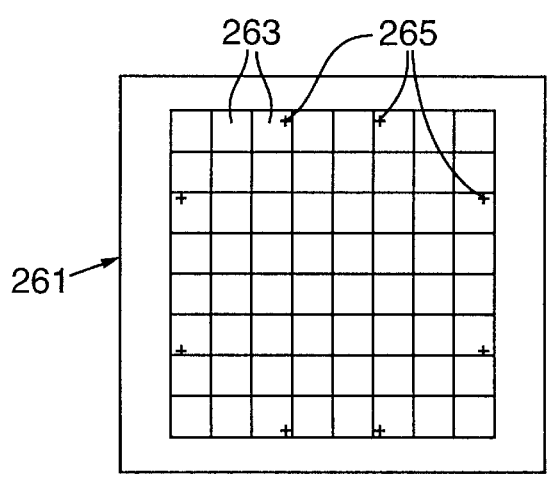
FIG. 11 is a plan view of a mask used to illustrate application of the method of the present invention to alternative mask embodiments.

To illustrate application of the method of the pre sent invention to masks other than those masks of the present invention, a typical or conventional mask having a single reticle, is illustrated in FIG. 11. The mask 261 comprises a pattern divided into a plurality of mask subfields 263 positioned adjacent one another in a grid pattern. The mask subfield 263 is irradiated with a charged-particle beam or other suitable energy source so that a resulting image is reduced and formed on the sensitive substrate.

The mask 261 further comprises at least eight alignment marks 265 disposed thereon. Utilizing one of the detection systems discussed above in relation to the pattern-transfer apparatus, the positional coordinates of each alignment mark are determined. By statistical analysis, the mask position, rotation, scaling, and orthogonality are determined (as described below,) and error-correction amounts are calculated. Exposure of the sensitive substrate to the mask-patterns is performed, while adjusting the position of the beam, the mask, and the sensitive substrate, by amounts necessary to correct for the determined scaling, positional, and rotation errors of each mask subfield.

The following is an example of the statistical analysis that may be performed to determine the amount of correction for the mask 261.

(1) The positional coordinates of several of the subfields are determined. Based on the measured or "actual" positional coordinates; and the "design" positional coordinates of the same, error parameters are determined for the subfields.

(2) A first sample statistic (i.e., a statistic regarding random position error of the measured subfield) based on the positional coordinate error of a first measured subfield (based on the actual versus design positional coordinates) and a second sample statistic (i.e., a statistic regarding random measurement error) based on the positional coordinate of the alignment marks 287 of the subfields are input to an arithmetic/logic unit.

(3) Using the determined error parameters, first sample statistic, and second sample statistic, the actual position of the measured mask subfield is determined using, for example, the least-squares estimation method. That is, the least-squares estimation method (or other suitable calculations known to those persons skilled in the art) provides estimated orientation and positional coordinates data of the measured subfields.

(4) After determining a position estimation filter, the determined orientation and positional coordinates obtained by measuring the actual positions of the alignment marks of the subfields are input into the position-estimation filter. The mask, substrate, and/or the charged-particle beam (or other energy source) are then positioned based on the estimated orientation and positional coordinates data of the subfields output from the position-estimation filter. For further reference regarding the correction functions (position-estimation filter) and the enhanced global alignment method, please see Japanese Laid-Open Patent Documents Hei 3-153015, Sho 62-291133 and Sho 61-44429.

Figure 12:
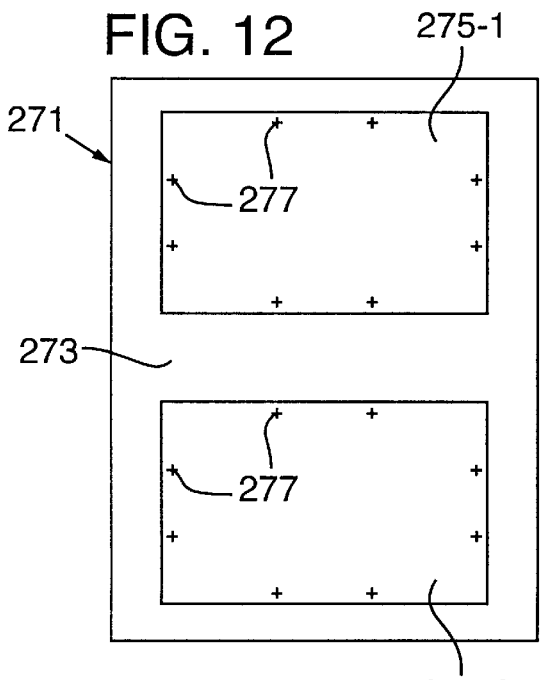
FIG. 12 is a plan view of a mask used to illustrate application of the method of the present invention to alternative mask embodiments.

To illustrate application of the methods of the present to masks having two or more reticles, a mask 271, shown in FIG. 12, is described herein. The mask 271 comprises a pattern divided into at least two mask reticles 275-1, 275-2 positioned adjacent one another and mounted on a retention member 273. The retention member 273 and mask reticles 275-1, 275-2, are preferably comprised of the respective materials discussed above in relation to the first embodiment of the mask of the present invention. The mask reticles define respective patterns divided into a plurality of subfields (as with mask 261 shown in FIG. 11) positioned adjacent one another in a grid pattern. At least eight alignment marks 277 are formed on each of the mask reticles 275-1, 275-2.

Figure 13:
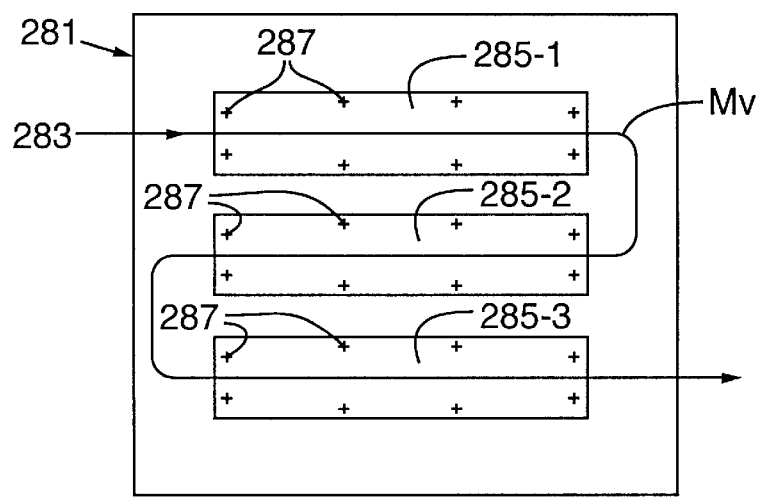
FIG. 13 is a plan view of a mask used to illustrate application of the method of the present invention to alternative mask embodiments.

The method of the present invention is also applicable to the mask embodiment shown in FIG. 13. A mask 281 comprises a pattern divided into at least three mask reticles 285-1, 285-2, 285-3 positioned adjacent one another and mounted on a retention member 283. The retention member 283 and mask reticles 285-1, 285-2, 285-3 may comprise the respective materials discussed above in relation to the first embodiment of the mask of the present invention. Each of the mask reticles 285-1, 285-2, 285-3 further comprises a respective pattern divided into a plurality of subfields. The subfields are positioned adjacent one another in a grid pattern (as with mask 261 shown in FIG. 11). At least eight alignment marks 287 are formed on each of the mask reticles of the mask 281.

By determining the positions of the mask-alignment marks and making appropriate corrections during transfer of the subfield patterns to the sensitive substrate, mechanically or thermally induced distortion errors of each mask reticle are corrected, providing a superior accuracy level in the pattern transfer. Further, because the correctable range is wider, there is also the effect of lessening the accuracy required for the mask. For example, if the mask reticles are not formed or adhered accurately on the retention member (e.g., there is positional error in the reticle placement) the methods of the present invention can correct such error before the pattern image is formed on the wafer.

The path of arrow Mv in FIG. 13 illustrates the preferred path of mask-stage movement during the mask-reticle positional coordinate measurement. With such movement of the mask stage during pattern transfer of pattern images to a sensitive substrate, the mask-reticle positional-coordinate measurement may be performed while the mask-pattern transfer takes place. That is, the positional coordinate measurement may be made, and then the transfer of each subfield performed while correcting for positional error as determined based upon the positional coordinate measurement. The mask may be moved along the path Mv while continuing to make such error measurements, and corrections based on such measurements, and then performing the pattern-image transfer for the selected subfield. Accordingly, positional-coordinate-measurement results are obtained that reflect the necessary mask-stage movement and charged-particle-beam deflection needed to provide accurate transfer of mask-patterns.

By performing mask alignment for each mask reticle of the masks of the present invention, the position accuracy of the pattern transfer remains constant or improves even when dividing the mask into a plurality of subfields. Moreover, because the portion of the mask reticle in which mask alignment is performed is smaller than the entire mask-reticle surface or the entire mask surface, the requirement of absolute positional accuracy of each pattern as formed on the mask is not nearly as strict as with conventional masks and methods.

Because the masks of the present invention are comprised of a plurality of mask reticles on a single retention member, it is possible to produce a mask having a larger pattern-surface area using semiconductor wafers of conventional, available size. Further, the wafer from which mask reticles are formed may be minimally supported, while still providing the advantages of a thin-film mask. In addition, reductions in mask-pattern-image precision, and increases in the cost of mask production are limited. Further, if an irreparable pattern defect occurs, the single defective mask reticle may be replaced, avoiding the cost of replacing an entire mask, as is required with conventional masks.

When using a scanning pattern-transfer apparatus, even though the mask reticle is divided into multiple mask subfields, by forming a continuous exposure region of the subfields, each region can be continuously scanned. The scan of the divided mask-pattern is still performed on a subfield-by-subfield basis, but the motion between the subfields is continuous rather than being a start-and-stop motion. Accordingly, the wafer throughput is relatively high.

In addition, because the mask reticles of the masks of the present invention are not individually mounted on the mask stage of a pattern-transfer apparatus, but instead are mounted to a single retention member, the positions of the mask reticles are less likely to change significantly as the mask is loaded and/or used in a pattern-transfer apparatus. Accordingly, the time period necessary for alignment of the individual mask reticles is relatively short when compared to multiple, relatively small masks.

Having illustrated and demonstrated the principles of the invention in multiple example embodiments, it should be apparent to those skilled in the art that the preferred embodiment can be modified in arrangement and detail without departing from such principles. We claim as the invention all that comes within the scope of these claims.

What is claimed is:

1. A method for aligning a mask-pattern image and for projecting a corrected mask-pattern image onto a sensitized surface of a sensitive substrate on a substrate stage using a charged-particle-beam pattern-transfer apparatus, the method comprising the steps of:

(a) providing a mask comprising a mask-pattern defined by a plurality of mask reticles, wherein each mask reticle comprises a separate respective mask substrate and the pattern defined by each mask reticle being segmented into multiple mask-reticle subfields, the mask further comprising a retention member to which the plurality of mask reticles comprising the separate respective mask substrates are secured, a fiducial mark on the retention member, and respective fine-alignment marks formed on the mask reticles at prescribed locations;

(b) determining a design position of at least one of the mask reticles relative to the retention member;

(c) storing data, corresponding to the determined design position of the at least one mask reticle relative to the retention member, in a memory;

(d) irradiating selected fine-alignment marks on the at least one mask reticle with the charged-particle beam and projecting images of the irradiated fine alignment marks onto the sensitive substrate;

(e) determining an actual position of the retention member relative to the sensitive substrate by detecting positions of the fiducial mark located on the retention member and detecting positions of the images of the fine-alignment marks formed on the sensitive substrate;

(f) recalling the design-position data of each mask reticle relative to the retention member, and comparing the actual-position data of the retention member relative to the sensitive substrate with the design-position data of each mask reticle relative to the retention member to obtain data concerning a type and amount of correction required to make the positions of selected mask-reticle subfields coincide with positions of corresponding sensitive substrate subfields, the correction being to at least one of scaling, rotation, and position errors resulting from distortion or movement of the mask reticles;

(g) based on the data determined in step (f), moving the mask stage, moving the substrate stage, or altering a characteristic of the charged-particle beam to correct the at least one of scaling, rotation, and position errors by the determined correction amount; and (h) exposing a selected mask subfield using the corrected charged-particle beam to form an image of the mask subfield on the corresponding sensitive substrate subfield.

2. The method of claim 1, further comprising the step of directing the charged-particle beam through a condenser lens to focus the charged-particle beam prior to directing the charged-particle beam onto the alignment marks.

3. The method of claim 1, wherein the steps (b) through (f) are performed for each of the mask reticles and based on the data determined in step (f), moving the mask stage, moving the substrate stage, or altering a characteristic of the charged-particle beam to correct the at least one of scaling, rotation, and position errors by the determined correction amount.

4. The method of claim 1, wherein step (b) is performed prior to mounting the mask in the pattern-transfer apparatus.

5. A method for aligning a mask-pattern image and for projecting a corrected mask-pattern image onto a sensitized surface of a sensitive substrate on a substrate stage using a charged-particle-beam pattern-transfer apparatus, the method comprising the steps of:

(a) providing a mask comprising a mask-pattern defined by a plurality of mask reticles, wherein each mask reticle comprises a separate respective mask substrate and the pattern defined by each mask reticle being segmented into multiple mask-reticle subfields, the mask further comprising a retention member to which the plurality of mask reticles comprising the separate respective mask substrates are secured, a fiducial mark on the retention member, respective fine-alignment marks formed on the mask reticles at prescribed locations, and a reference mark formed on a substrate stage immediately adjacent to the sensitive substrate;

(b) before mounting the mask in a pattern-transfer apparatus for the purpose of projection-exposing the pattern defined by the mask reticle onto the sensitive substrate, determining a design position of at least one of the mask reticles relative to the retention member;

(c) storing data, corresponding to the determined design position of the at least one mask reticle relative to the retention member, in a memory;

(d) mounting the mask on a mask stage in the pattern-transfer apparatus;

(e) determining an actual position of the retention member relative the sensitive substrate by detecting positions of the fiducial mark located on the retention member and detecting the position of the reference mark on the substrate stage;

(f) recalling the design-position data of each mask reticle relative to the retention member, and comparing the actual-position data of the retention member relative to the sensitive substrate with the design-position data of each mask reticle relative to the retention member to obtain data concerning a type and amount of correction required to make the positions of selected mask-reticle subfields coincide with the position of corresponding sensitive substrate subfields, the correction being to at least one of scaling, rotation, and position errors resulting from distortion or movement of the mask reticles;

(g) based on the data determined in step (f), moving the mask stage, moving the substrate stage, or altering a characteristic of the charged-particle beam to correct the at least one of scaling, rotation, and position errors by the determined correction amount; and (h) exposing a selected mask subfield using the corrected charged-particle beam to form an image of the mask subfield on the corresponding sensitive substrate subfield.

6. The method of claim 5, wherein steps (b) through (f) are performed for each of the mask reticles and based on the data determined in step (f), moving the mask stage, moving the substrate stage, or altering a characteristic of the charged-particle beam to correct the at least one of scaling, rotation, and position errors by the determined correction amount.

* * * * *

UNITED STATES PATENT AND TRADEMARK OFFICE
CERTIFICATE OF CORRECTION

PATENT NO. : 6,171,736 B1
DATED : January 9, 2001
INVENTOR(S) : Noriyuki Hirayanagi It is certified that error appears in the above-identified patent and that said Letters Patent is hereby corrected as shown below:

Column 2,
Lines 20-21, change "demagnification-n ratios" to -- demagnification ratios --

Column 4,
Line 12, change "oil" to -- of --

Column 5,
Line 4, change "reticle" to -- reticles --
Line 8, change "o)f" to -- of --

Column 6,
Line 42, change "(m,n) of" to -- (m,n)) of --
Line 43, change "(m,n) on" to -- (m,n)) on --
Line 50, change "3E. is" to -- 38 is --

Column 8,
Line 3, change "maskretention" to -- mask-retention --
Line 58, change "axis. and" to -- axis and --

Column 9,
Line 26, change "can" to -- an --

Column 10,
Line 13, change "mask. 110." to -- mask 110. --

Column 12,
Line 17, change "memory, device" to -- memory device --
Line 42, change "reticle" to -- reticles --

UNITED STATES PATENT AND TRADEMARK OFFICE
CERTIFICATE OF CORRECTION

PATENT NO. : 6,171,736 B1
DATED : January 9, 2001
INVENTOR(S) : Nriyuki Hirayanagi It is certified that error appears in the above-identified patent and that said Letters Patent is hereby corrected as shown below:

Column 13,
Line 16, change "define" to -- defined --

Column 14,
Line 49, change ",)" to -- ), --

Signed and Sealed this

Twenty-ninth Day of January, 2002

*Attest:*

*Attesting Officer*

JAMES E. ROGAN
*Director of the United States Patent and Trademark Office*